(12) United States Patent
Ichino et al.

(10) Patent No.: US 7,265,333 B2
(45) Date of Patent: Sep. 4, 2007

(54) LIGHT-RECEIVING CIRCUIT

(75) Inventors: Moriyasu Ichino, Yokohama (JP); Sigeo Hayashi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/198,394

(22) Filed: Aug. 8, 2005

(65) Prior Publication Data

US 2006/0027736 A1 Feb. 9, 2006

(30) Foreign Application Priority Data

Aug. 9, 2004 (JP) .............................. 2004-232662

(51) Int. Cl.
*G01J 1/44* (2006.01)
*H01J 40/14* (2006.01)
*H03F 3/08* (2006.01)

(52) U.S. Cl. .............................. 250/214 R; 250/214 A; 330/308

(58) Field of Classification Search ............ 250/214 R, 250/214 VT, 214 A, 214 LA, 214 LS; 330/308
See application file for complete search history.

(56) References Cited

U.S. PATENT DOCUMENTS 6,426,495 B1 * 7/2002 Hayami et al. ......... 250/214 R
7,071,455 B2 * 7/2006 Irie ......................... 250/214 R
2003/0178552 A1 * 9/2003 Hofmeister et al. .... 250/214 R
2005/0001150 A1 * 1/2005 Yonemura ............... 250/214 R

FOREIGN PATENT DOCUMENTS

| JP | 59-160345 | 9/1984 |
| JP | 02-050534 | 2/1990 |
| JP | 05-343926 | 12/1993 |
| JP | 10-303820 | 11/1998 |
| JP | 2000-244418 | 9/2000 |

* cited by examiner

*Primary Examiner*—Georgia Epps
*Assistant Examiner*—Patrick J. Lee
(74) *Attorney, Agent, or Firm*—Smith, Gambrell, & Russell, LLP

(57) ABSTRACT

The present invention is to provide a light-receiving circuit, in particular, the circuit for an avalanche photodiode (APD), in which the current of the APD is dynamically controlled to protect the APD from the over current. The circuit comprises the high voltage source, the current mirror circuit connected to the high voltage source, the APD connected to one of the current output terminal of the current mirror circuit, and the current source connected to the other current output terminal of the current mirror circuit. The current flowing out from the other current output terminal is dynamically controlled by the current source to protect the APD from the over current.

14 Claims, 9 Drawing Sheets

LIGHT-RECEIVING CIRCUIT

BACKGROUND OF THE INVENTION

1. Field of the Invention

The present invention relates to a light-receiving circuit applicable to an optical receiver and an optical transceiver each constituting a portion of an optical network

2. Related Prior Art

In the conventional optical receiver and the optical transceiver, light-receiving circuits are widely used in which an avalanche photodiode (hereinafter denoted as APD) is installed as a light-receiving device.

Japanese Patent publication JP-2000-244418A has disclosed a light receiving circuit that provides a PIN-PD for receiving light with a same input level with that for the APD together with a temperature sensor and a memory. The circuit provides the optimal bias voltage reading out from the memory depending on the input optical level, which is monitored by the PIN-PD, and the temperature monitored by the temperature sensor. Another Japanese Patent publication JP-H10-303820A has disclosed a configuration, in which the bias voltage is adjusted, when the input optical level instantaneously happens to vary in a low level by sensing this instantaneous fluctuation by the PIN-PD.

Still another Japanese Patent issued as JP-H01-029333B has disclosed a circuit that adjusts the current of the APD by installing a transistor connected in parallel to the APD and to the constant current source. This type of control, i.e., control of the current for the APD, shows a superior response to the type the bias voltage is adjusted. Japanese Patent publication as JP-H10-275129A has disclosed a light-receiving circuit that includes a transistor connected between the bias voltage source and the APD. By adjusting the base current of this transistor, the voltage drop between the collector and the emitter thereof may be adjusted, thus the bias voltage to the APD can be controlled.

Another Japanese Patent published as H05-343926 has disclosed an circuit for the APD, which provides a resistor connected in series to the APD and, by adjusting the resistance thereof and the bias voltage to the APD, the multiplication factor inherently attributed to the APD may be set in an optical value.

However, the method to apply the bias voltage to the APD using the parameter stored in the memory has an intrinsic disadvantage that the circuit can not follow the sudden change in the input optical level due to the memory read-out time, which causes an instantaneous increase of the APD current. Moreover, the method to reduce the bias voltage to the APD by the transistor or another active device connected between the bias voltage source and the APD, although showing the preferable response to the sudden change of the input optical level not only an addition circuit to control the active device is necessary but also the power dissipation due to this active device must be considered. Another circuit disclosed in the prior art, in which the transistor is connected in parallel to the APD, also consumes the surplus current to provide the optimal current to the APD.

In the circuit with the resistor for the current feedback to the APD, this resistor inevitably consumes the power, i.e., the resistor sets the optical bias condition for the APD by reducing the output of the voltage source, in particular, when the input optical level is large, the power dissipation due to this resistor becomes worse. Moreover, in order to secure a substantial multiplication actor of the APD, the output of the voltage source must be kept comparatively high, which further increases the power dissipation.

Therefore, an object of the present invention is to salve the subjects above mentioned and to provide a light-receiving circuit that enables to protect the APD, even when the APD receives the sudden optical pulse, by controlling the current flowing in the APD dynamically.

SUMMARY OF THE INVENTION

A light-receiving circuit according to the present invention comprises a voltage source, a current mirror circuit, an avalanche photodiode (APD), and a current source. The voltage source, the current mirror circuit, and the APD are connected in serial to each other. That is, the current mirror circuit receives the output of the voltage source, and the APD is connected to a current mirroring terminal, not to a current setting terminal, of the current mirror circuit to receive a bias voltage from the current mirror circuit. The current source is connected to the current setting terminal of the current mirror circuit to define a reference current that reflects in the current flowing in the APD.

The reference current may be determined such that a voltage generated by a reference resistor included in the current source by flowing in the reference current corresponds to the bias voltage. That is, the current source further includes a transistor connected between the reference resistor and the current setting terminal of the current mirror circuit. This transistor output the reference current such that a voltage drop due to the reference current flowing in the reference resistor becomes substantially equal to a voltage obtained by dividing the bias voltage of the APD.

Another configuration of the present light-receiving circuit includes a PIN-photodiode (PIN-PD) to receive a portion of the input optical signal and to output a monitored current. The light-receiving circuit may reflect this monitored current into the reference current.

In specifically, the PIN-PD is connected in serial to a first reference resistor to convert the monitored current into a reference voltage. While, the current source includes a second reference resistor and a transistor. The transistor connected between the second reference resistor and the current setting terminal of the current mirror circuit. The transistor outputs the reference current such that a voltage drop due to the second reference resistor by flowing the reference current therein becomes substantially equal to the reference voltage due to the monitored current.

The light-receiving circuit may further include a limiting circuit that cramps the reference voltage generated by the monitored current. The limiting circuit may include a diode and a resistor connected in parallel to the diode. These diode and resistor are connected in serial to the first reference resistor. Since the diode and the resistor cramps the reference voltage to about 0.7 V, the reference current may be also limited accordingly.

One modification of the present light-receiving circuit may include another current mirror circuit. This current mirror circuit may also have a current setting terminal and a current mirroring terminal. The PIN-PD is connected to the current setting terminal, while the current mirroring terminal is connected to the current setting terminal of the first current mirror circuit. Accordingly, the monitored current generated by the PIN-PD can be reflected in the reference current via two current mirror circuits.

Another modification of the present light-receiving circuit may include a feedback control circuit to lower the output of the voltage source by receiving the bias voltage to the APD. This feedback control circuit may include a differential amplifier to receive the voltage of the current setting terminal and the current mirroring terminal of the current mirror circuit, and to control the output of the voltage source such that these two voltages of two terminals becomes substantially equal to each other, that is, the potential of the current setting terminal is substantially equal to the bias voltage.

In this feedback control circuit, the gain of the closed-loop, constituted by the voltage source, the current mirror circuit, and the feedback control circuit, is comparatively small, preferably from 2 to 5.

DESCRIPTION OF PREFERRED EMBODIMENTS

Next, preferred embodiments of the present invention will be described as referring to FIGS. 1 to 9. In the explanation below, the same numerals or symbols will refer to the same elements without overlapping explanations.

First Embodiment

Figure 1A:
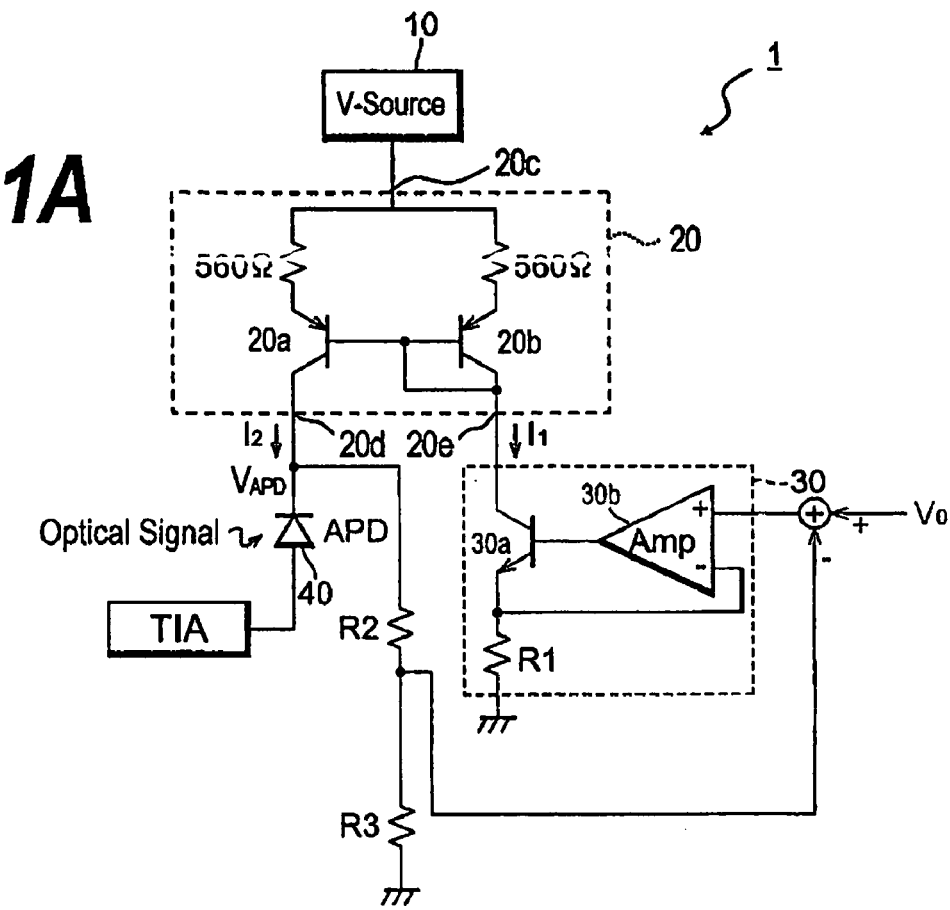
FIG. 1A is a circuit diagram of the light-receiving circuit according to the first embodiment of the invention.
Figure 1B:
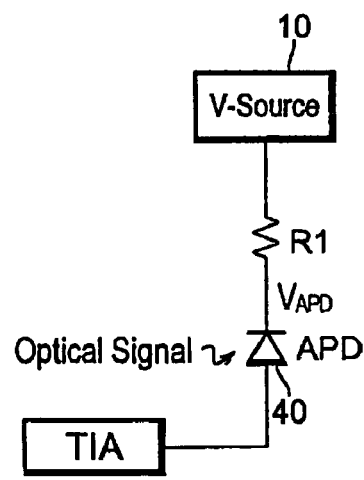
FIG. 1B is an equivalent circuit diagram of the light-receiving circuit shown in FIG. 1A.

FIG. 1A and FIG. 1B are circuit diagrams showing a light-receiving circuit according to a first embodiment of the invention. The light-receiving circuit 1 of the invention has, as a fundamental configuration, a voltage source 10, a current mirror circuit 20, an avalanche photodiode (hereinafter denoted as APD) 40 as a light-receiving device, and a current source 30. The current mirror circuit 20, as shown in FIG. 1A, has one input terminal 20c and a pair of serially connected transistors, 20a or 20b, and a resistor, each forming a current path connected to the input terminal 20c and provided with two output terminals, i.e., a current mirroring terminal 20d and a current setting terminal 20e. The currents, I1 and I2, flowing in respective current paths of the current mirror circuit 20 have a preset relation in the magnitude thereof determined by the size of each transistor and the resistance of the resistor. In the embodiment shown in FIG. 1A, the resistors placed in respective paths are the same, and transistors, although not explicitly shown, have substantially the same size. Accordingly, the currents, I1 and I2, become substantially the same. The one current path where the current I2 is flowing therein connects to the APD 40, while the other current path where the current I1 is flowing therein connects to the current source 30. It is well known for a light-receiving circuit that the APD is connected in serial to the current mirror circuit to monitor the current flowing in the APD. However, the circuit configuration of the present invention has a feature that the APD 40 is connected to the current mirroring terminal, not to the current setting terminal of the current mirror circuit as is conventional. In FIG. 1A, the trans-impedance amplifier (TIA) converts the photo current generated in the APD 40 into a voltage signal and transmits this voltage signal to the signal processing stage, which is not shown in FIG. 1A.

The APD 40 has a carrier multiplication characteristic with a multiplication factor M depending on the applied bias voltage $V_{APD}$, which enhances the sensitivity of the APD compared with that of the PIN-PD. The optimal sensitivity of the APD 40 should be controlled. The multiplication factor M of the APD 40 is denoted as:

$$M = I_{OUT}/(0.805*\eta*\lambda(\mu m)*P_{IN}) \quad (1)$$

where, $I_{OUT}$ is the photo current generated in the APD 40, $\eta$ is the quantum efficiency of the APD 40, $\lambda$ is the wavelength of the optical signal, and $P_{IN}$ is the optical power of the input optical signal.

The light-receiving circuit 1 shown in FIG. 1A adjusts the photo current $I_{OUT}$ of the APD 40 to determine the multiplication factor M. Assuming the $V_{APD}$ is the bias voltage $V_{APD}$ to the APD 40 and $V_O$ is the target voltage for the control the amplifier 30b included in the current source operates so as to make two inputs thereof equal to each other through the feedback by two resistors, $R_1$ and $R_2$. That is:

$$V_O - V_{APD}*R3/(R2+R3) = I_1 (=I_2)*R_1 \quad (2)$$

where the base current of the transistor 30a involved in the current source 30 is assumed to be negligible compared to the corrector current $I_1$, and the two currents, $I_1$ and $I_2$, flowing out from the current mirror circuit 20 are substantially same to each other. The left side of the equation (2) corresponds to the non-inverting input of the amplifier, while the right side thereof corresponds to the inverting input of the amplifier 30b.

The relation between the bias voltage $V_{APD}$ and the multiplication factor M of the APD 40 is denoted as:

$$M = 1/\{1-(V_{APD}/V_B)^n\}$$

$$V_B = V_{Bo}*(1+\Delta T*\beta) \quad (3)$$

where VB is the breakdown voltage of the APD 40 and $\beta$ is the temperature coefficient of the breakdown voltage, which is typically 0.1 to 0.3%/C.

From the equations above explained, the multiplication actor M may be determined by controlling the photo current $I_2$ (=$I_1$) to satisfy the above relations, in other words, by controlling the bias voltage $V_{APD}$ such that the photo current $I_2$ (=$I_1$) satisfies the above equations, the optimal multiplication actor M may be determined. For example, when no optical signal is input to the APD 40, the bias voltage $V_{APD}$ becomes $V_0*(R_2+R_3)/R_1$ from the equation (2) because the photo current $I_2$=0. As increasing the input optical level the bias voltage $V_{APD}$ decreases by $I_2*R_1*(R_2+R_3)/R_3$, which equivalently decreases the multiplication factor M.

Rewriting the equation (2);

$$V_{APD} = (V_0 - I_2*R1)*(R2+R3)/R3 \quad (2)'$$

Therefore, the light-receiving circuit 1 shown in FIG. 1A can be configured in an equivalent circuit shown in FIG. 1B. That is, the output $V_O$ of the high voltage source 10 is led to the APD 40 through the resistor $R_1$. The current flowing in the APD 40 becomes $(V_O-V_{APD})/R_1$. When the total resistance of two resistors, $R_2$ and $R_3$, is far greater than the equivalent resistance of the APD, the current shunted to these resistors from the current $I_2$ may, be neglected. Moreover, in the case that the condition $R_3>>R_2$ is satisfied, not only the non-inverting input of the amplifier 30b is lowered but also the rate of decreasing the bias voltage $V_{APD}$ becomes $I_2*R_1*(R_2+R_3)/R_3 \sim I_2*R_1$, because $(R_2+R_3)/R_3$ becomes nearly unity.

The light-receiving circuit 1 shown in FIG. 1A has several advantages. First, since the resistor $R_1$ is not inserted between the voltage source 10 and the APD 40, the power consumption by this resistor can be saved. The current I2 of the APD 40 often exceeds a few milli-ampere and the resistance of the series resistor reaches a few scores or so to hundreds kilo-ohm. Accordingly, the power consumption by the resistor becomes considerable. The present light-receiving circuit places this resistor apart from the APD 40. Next, the input of the amplifier in the current source is lowered by $R_3/(R_2+R_3)$. That is, in the case $R_3>>R_2$, the input of the amplifier is enough lowered even the bias voltage $V_{APD}$ is provided from the high voltage source 10, which often exceeds 50V or greater in the output thereof. The target voltage $V_O$ conventionally had to be assumed over a few scores or so of voltage, while, in the present invention, it becomes only a few volts or less by lowering by $R_3/(R_2+R_3)$. Therefore, ordinal amplifier inapplicable to a high voltage input may be applied in the current source 30, and the power consumption by the resistor R1, which has the same function with that directly connected between the high voltage source 10 and the APD 40, can be saved.

Figure 2:
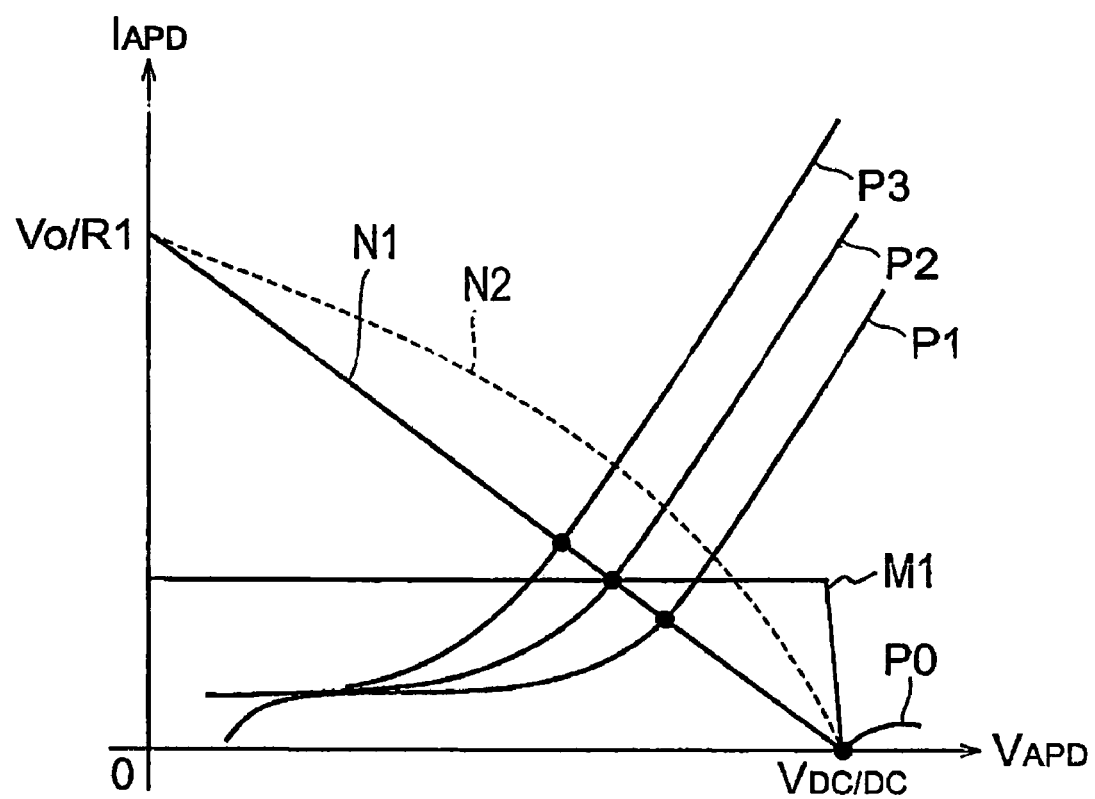
FIG. 2 explains an operation of the avalanche photodiode configured in FIG. 1A.

FIG. 2 shows an operating characteristic of the APD 40 in FIG. 1A. In FIG. 2, the line N1 corresponds to the load line of the APD 40 in the first embodiment, the line N2 is the load line of the APD in the second embodiment explained later, and the line M1 corresponds to the conventional case when the current of the APD 40 is kept constant by the current mirror circuit. Moreover, the line $P_0$ is the I-V characteristic of the APD when the no optical power enters. The lines from P1 to P3 denote the I-V characteristics of the APD 40 when the input optical power increase form P1 to P3 (P1<P2<P3), respectively.

As shown in FIG. 2, when no optical signal is input in the APD 40, no photo current may be generated thereby. Accordingly, the operating point of the APD 40 is in the rightmost end of the load line N1. Increasing the input optical level, the operating point shifts toward left on the load line N1, which is equivalent to the decrease of the bias voltage $V_{APD}$ of the APD 40.

On the other hand, the operation of the conventional circuit using the current mirror circuit denoted by the line M sets the operating point thereof in the rightmost end at no optical input level and abruptly increases the photo current to a value determined by the current mirror circuit. In this transition, the change of the bias voltage $V_{APD}$ is quite small. When the APD receives the optical signal with a substantial power, the current mirror circuit immediately operates to kept the photo current constant independent of the optical input power.

The light receiving circuit 1 according to the present invention has the function to prevent such abrupt change in the photo current of the APD 40, what is more, the function may be realized in the low voltage. Although the light-receiving circuit of the invention provides the current mirror circuit 20 as the conventional circuit does, the potential difference is recognized in two points. One is due to the resistor R1, which sets the magnitude of the current flowing in the current mirror circuit 20, varies with the change of the bias voltage $V_{APD}$ through two resistors, R2 and R3, and the amplifier 30b within the current source. The other us that the APD 40 is connected, not to the current setting terminal, to the current mirroring terminal of the current mirror circuit 20. Therefore, the present current mirror circuit 20 does not operate in the constant current mode. The present light-receiving circuit operates as the APD 40 is merely connected to the high voltage source 10 through the resistor R1, as shown in FIG. 1B.

Second Embodiment

Figure 3:
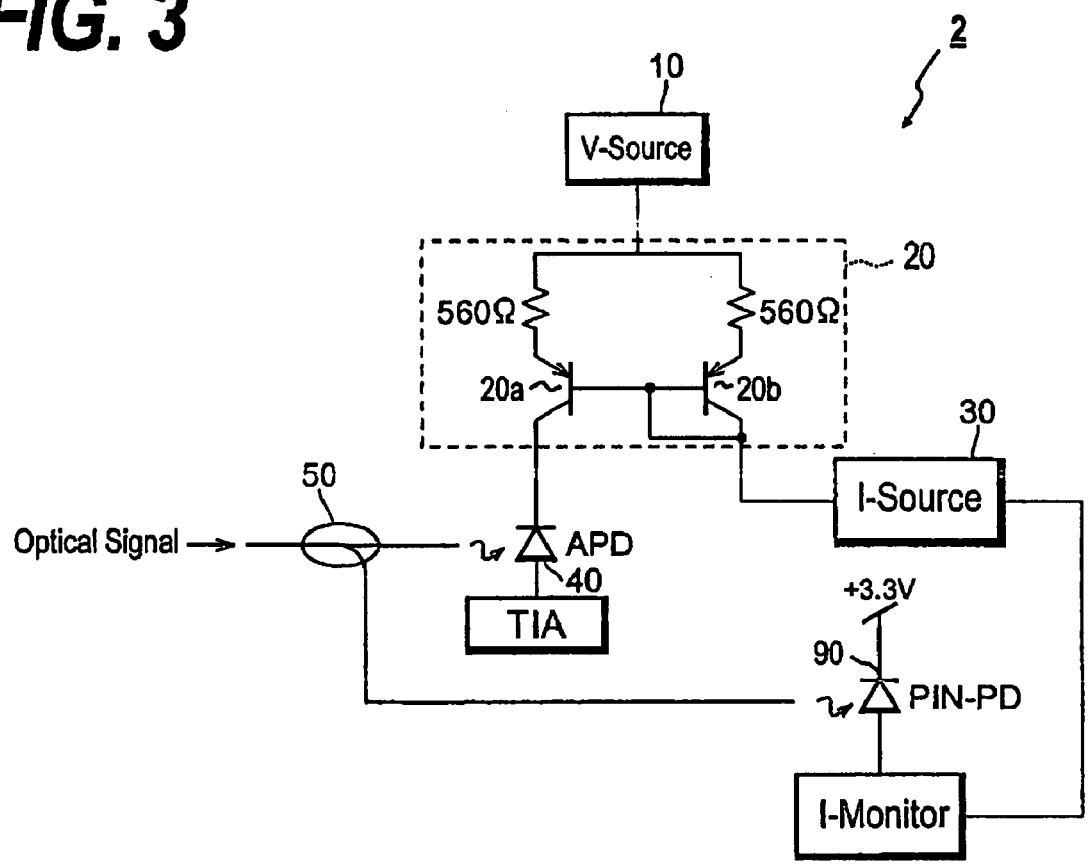
FIG. 3 is a block diagram of the light-receiving circuit according to the second embodiment of the invention.

The multiplication factor M of the APD may be set through the control of the photo current, in addition to the control based on the equation (1) according to the first embodiment, as long as the optical input level to the APD is detectable. FIG. 3 is a block diagram of the light-receiving circuit according to the second embodiment, which configures the control through the detection of the optical input level. The light-receiving circuit in FIG. 3, by branching off the optical input signal by a branching device 50 and monitoring the branched signal, controls the average current flowing in the APD 40 depending on the input optical level of thus branched optical signal.

Specifically, the optical coupler 50 divides the input optical signal. One of the divided signals enters the APD 40, while the other signal, which has a substantially same optical level with that enters the APD 40, heads for the PIN-PD 90. The current monitor converts the optical input level detected by the PIN-PD 90 into a voltage signal and outputs this voltage signal that reflects the input optical level to the current source 80. The current equivalent to that set by the current monitor and the current source 30 flows in the APD 40 through the current mirror circuit 20. The multiplication actor M of the APD 40 is obtained by the equation (1). The multiplication factor M also depends on the bias voltage $V_{APD}$; accordingly, even the temperature of the APD 40 varies, the bias voltage VAD follows this temperature variation to keep the multiplication factor constant M.

Figure 4:
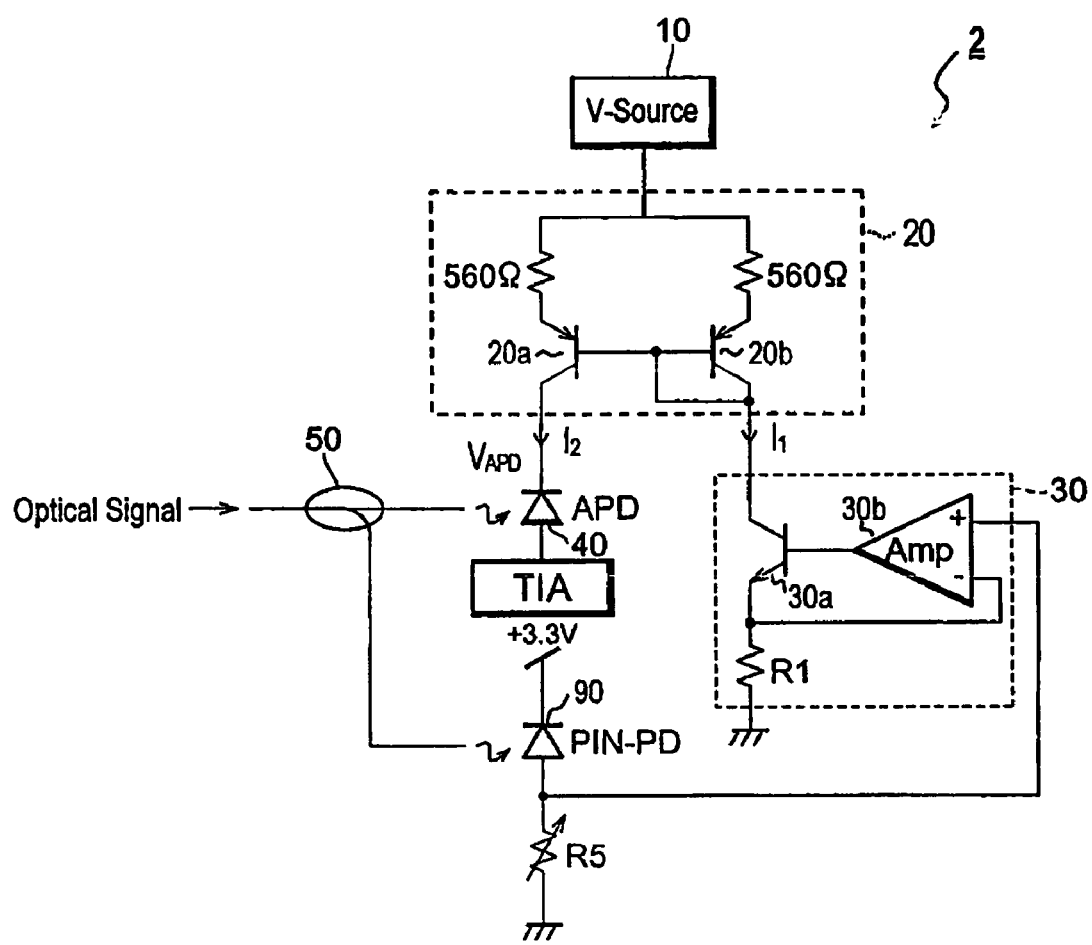
FIG. 4 is a circuit diagram of the light-receiving circuit according to the second embodiment of the invention.

FIG. 4 specifically shows the light-receiving circuit according to the second embodiment of the invention, whose block diagram is reflected in FIG. 3. The light-receiving circuit 2 in FIG. 4 converts the photo current generated in the PIN-PD 90 into a voltage signal by the variable resistor R5. The input optical level, which is branched by the optical coupler 50, is output from the one terminal of this variable resistor R5. The current source 30 receives this monitored signal in the non-inverting input of the amplifier 30b. As explained in the first embodiment, since the amplifier 30b operates such that two inputs thereof becomes equal, the current I1 equal to the current generated by the PIN-PD 90 flows in the resistor R1. Finally, the current I2 identical to the current I1 flows in the APD 40 by the operation of the current mirror circuit 20, which determines the multiplication factor M of the APD 40. The reference voltage caused by the resistor R1 reflects the current flowing in the APD 40. Therefore, a specific circuit for monitoring the current of the APD 40 becomes unnecessary in the present embodiment. When the optical coupler 50 is a 3 db-coupler, the APD 40 and the PIN-PD 90 receive the input optical signal in substantially same level. Assuming the quantum efficiency of respective detectors is equal to each other, the multiplication factor M is given by R5/R1. Even when the optical coupler 50 is not the 3 dB-coupler, the similar calculation will give the multiplication factor M.

Assuming the branching ratio in the optical coupler 50 is R and the quantum efficiency of the PIN-PD 90 is C(V/W), the current $I_{OUT}(=I_2)$ flowing in the APD 40 becomes p*R*C*(R5/R1). In the operation of the light-receiving circuit 1 explained in FIG. 2, the operating point of the APD 40 is set on the load line R1. While, in the second embodiment shown in FIG. 4, although the start and the end are same with those in the first embodiment, the load line reflects the P-I characteristic of the PIN-PD 90. The P-I characteristic of the PIN-PD 90 shows the large quantum efficiency in a weak optical level while decreases as the input optical level increases. Therefore, the load line for this second embodiment becomes, as shown in FIG. 2, a non-linear, a bell-shaped curve, with the start and the end identical to those in the first embodiment.

Setting the multiplication factor M, by adjusting the variable resistor R5, to obtain an optimal S/N ratio for the input optical signal, or to minimize the dark current of the APD 40, the optimal multiplication factor M may be obtained in the whole temperature range.

Figure 5:
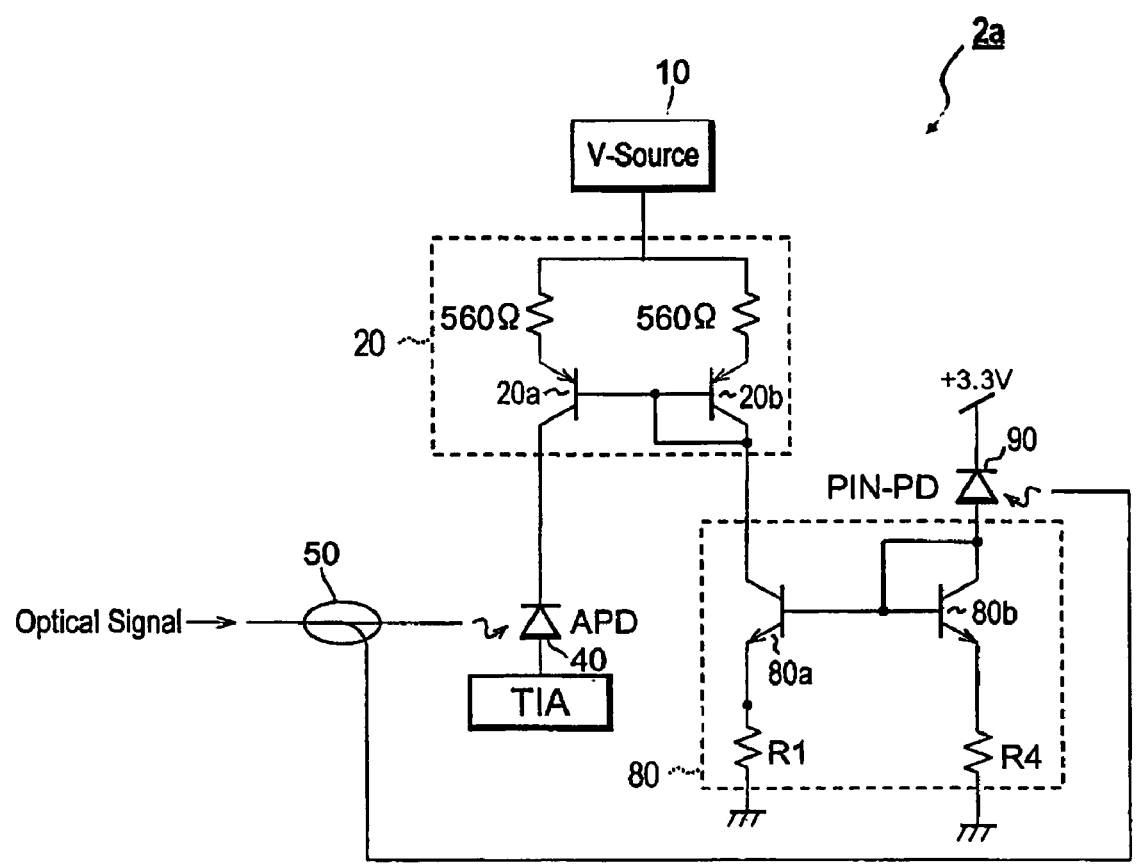
FIG. 5 is a circuit diagram of the light-receiving circuit according to one modification of the second embodiment of the invention.

FIG. 5 shows one modification 2a of the light-receiving circuit 2a according to the second embodiment shown in FIG. 4. The circuit 2a shown in FIG. 5 is equivalent to that shown in FIG. 4 in the aspect that the circuit controls the current flowing in the APD 40, but is different in that the current monitored by the PIN-PD 90, not converted into the corresponding voltage signal, directly controls the current of the APD 40.

The circuit 2a shown in FIG. 5 includes two current mirror circuits, 20 and 80, connected in serial to each other. The second current mirror circuit 80 includes two transistors, 80a and 80b, and two resistors, R1 and R4. The PIN-PD 90 is configured as the current source for the second current mirror circuit 80. The current generated by the PIN-PD 90, which depends on the input optical level to the PIN-PD 90, causes a voltage drop in the resistor R4. From the function of the current mirror circuit 80, this voltage drop in the resistor R4 equals to a voltage drop in the resistor R1 caused by the current I1. That is, the monitored current by the PIN-PD 90, which is denoted as P*R*C, multiplied by the resistance of the resistor R4 becomes equal to the product of the current I1 and the resistor R1, I1*R1. Moreover, the current I1 becomes equal to the current I2 flowing in the APD 40 by the first current mirror circuit 20. Therefore, the operation of this light-receiving circuit 2a is same as that shown and explained in FIG. 3.

Third Embodiment

Figure 6:
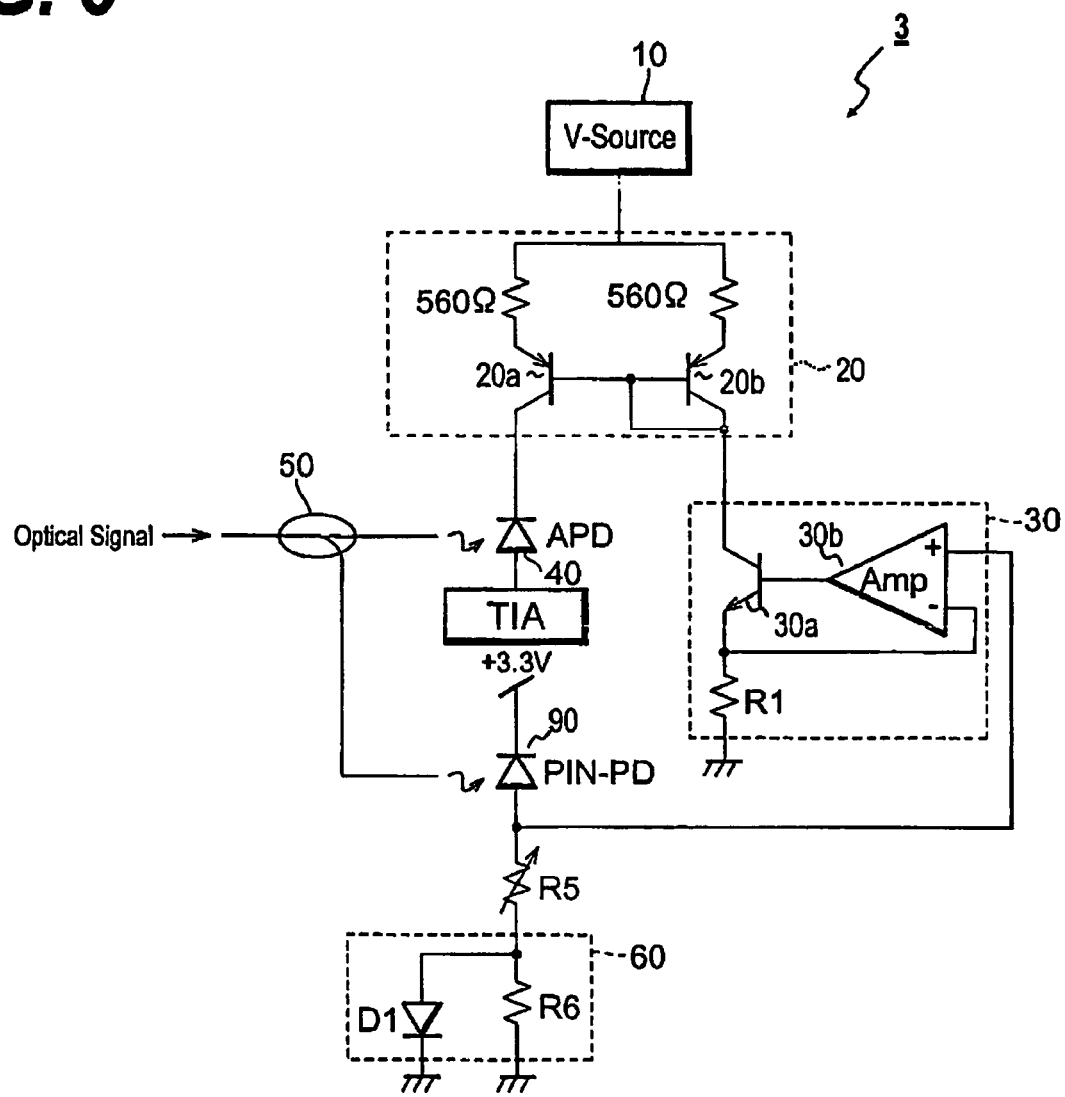
FIG. 6 is a circuit diagram of the light-receiving circuit according to the third embodiment of the invention.

FIG. 6 shows the third embodiment of the present invention. In the previous embodiment shown in FIGS. 4 to 5, since the PIN-PD 90 monitors the branched optical signal the multiplication factor M of the APD 40 is kept constant not only in the whole temperature range but also the whole optical input level. However, a practical system to receive the optical signal requires the optimal multiplication factor M in the minimum input optical level. In the case that such optimal factor M is kept constant in the maximum optical level, excess photo carriers will be generated by the APD, thus increases the power dissipation thereof. Furthermore, the larger optical input generates the larger current, which may cause that the APD 40 is broken by the current generated by the APD itself. Accordingly, the practical system adjusts the multiplication factor depending on the input optical level that is, the multiplication factor M is set from 7 to 10 at the minimum input level to enhance the opt sensitivity while the factor M is suppressed to about 3 at the maximum input level. The circuit shown in FIG. 5 provides a limiting circuit 60 within the current monitoring circuit. The limiting circuit 60, connected as a portion of the load resistance for the PIN-PD 90, includes a resistor R6 and a diode D1 connected in parallel to the resistor R6.

When the input optical level is small, the current generated in the PIN-PD 90 flows in the resistors, R5 and R6, to output the voltage signal $I_{PIN}$*(R5+R6) to the non-inverting input of the amplifier, where $I_{PIN}$ is the current generated by the PIN-PD 90. Increasing the input optical level and the voltage drop by the current $I_{PIN}$ at the resistor R6 and exceeding the turning on condition of the diode D1, which is typically about 0.7 V, the current $I_{PIN}$ is shunt to the diode to cramp the voltage drop at the resistor R6; to be about 0.7 V. Therefore, the output $V_{OUT}$ from the PIN-PD 90 becomes R5*$I_{PIN}$+0.7. In an example, using the 3 dB-coupler for the branching device 50, and assuming the quantum efficiency of the APD 40 and the PIN-PD 90 substantially equal, the multiplication factor M is given by:

$$M=(R5+R6)/R1 \quad (4)$$

at the voltage drop by the resistor R6 smaller than 0.7 V, while the factor M becomes:

$$M=(R5+0.7/I_{PIN})/R1 \quad (5)$$

at the region where the voltage drop by the resistor R6 exceeds 0.7 V.

Figure 7:
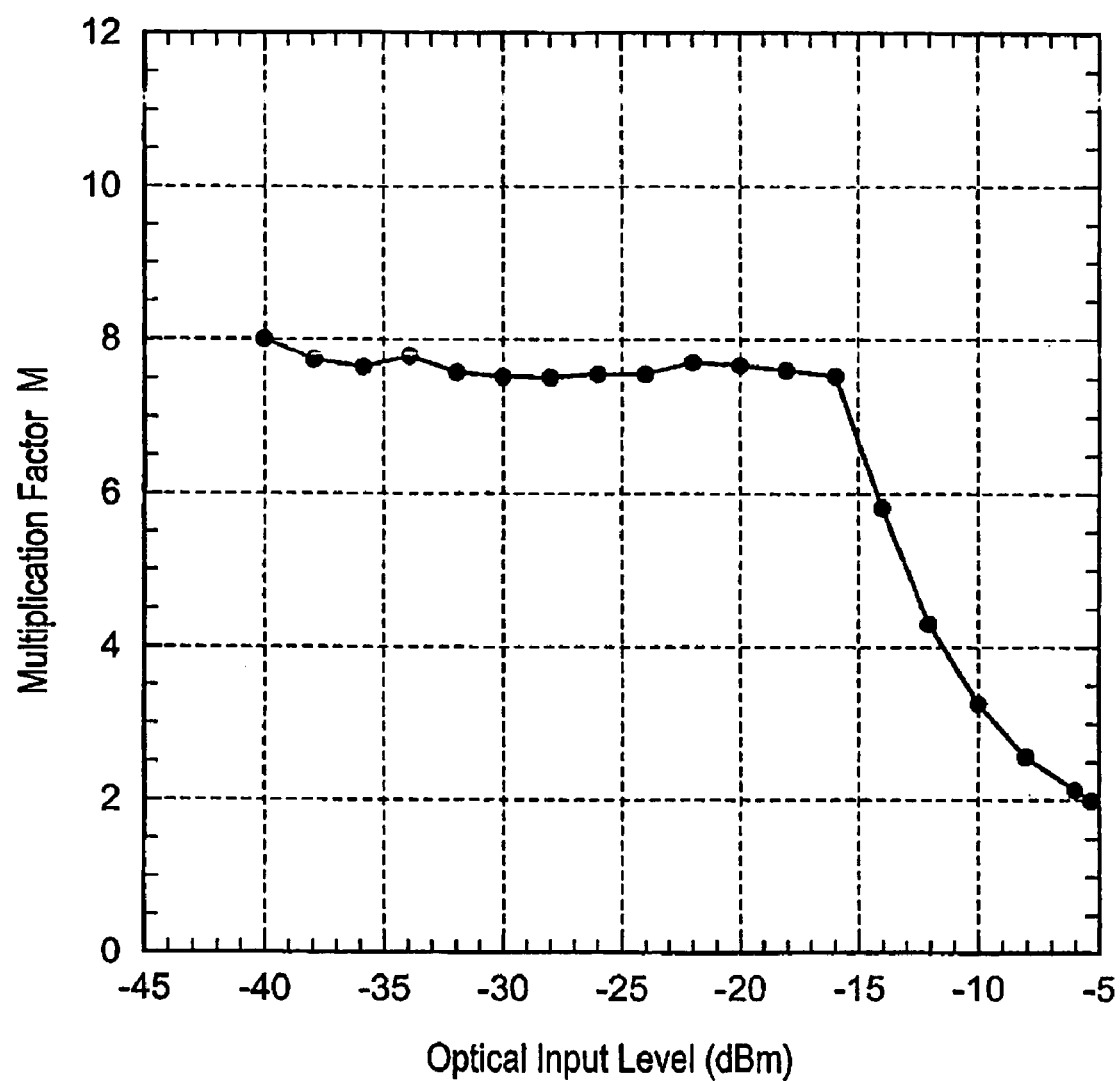
FIG. 7 shows the multiplication factor M of the avalanche photodiode configured in the fifth embodiment shown in FIG. 6.

The dependence of the multiplication factor M on the input optical level is shown in FIG. 7. As shown in FIG. 7, the multiplication factor M decreases in the region where the input optical level becomes greater than −16 dBm.

Increasing the current by the PIN-PD 90 as the input optical level increases, the voltage drop by the resistors, R5 and R6, also increases. When the voltage drop by the resistor R6 exceeds the forward turning-on voltage of the diode, about 0.7 V as already explained, the current $I_{PIN}$ is shunt to the diode. However, since the forward turning-on voltage is cramped to be about 0.7 V, the output $V_{OUT}$ of the current monitor circuit relaxes the rate of the increasing to $I_{PIN}$*R5+0.7. The current $I_{OUT}$ by the APD 40 is given by this monitored signal divided by the resistor R1. Accordingly, the $I_{OUT}$ is also suppressed in its increasing rate. The result that the current $I_{OUT}$ is suppressed despite the input optical level increases means the bias voltage $V_{APD}$ applied to the APD 40 is reduced as the input optical level increases, i.e., the multiplication factor M decreases.

The fluctuation of the multiplication actor M against the temperature depends on the temperature characteristic of the resistors, R1, R5 and R6, the input offset characteristic of the amplifier 30b, and the temperature dependence of the current mirror circuits, 20 and 80. However, the temperature dependence of these elements and circuits is comparatively small. The threshold optical level, by which the limiting circuit 60 begins to operate, depends on the quantum efficiency of the PIN-PD 90 and the turning-on voltage of the diode D1. These two elements also has small temperature dependence, accordingly, the threshold of the input optical level becomes comparatively stable for the temperature.

Even when the APD 40 receives a pulsed optical signal with an excessive level the present light-receiving circuit 3 controls, not the bias voltage $V_{APD}$ thereof the current by the APD 40, which increases the voltage drop by the resistor R6 within the limiting circuit and, as a consequent, the bias voltage $V_{APD}$ instantly drops, thereby preventing the APD 40 from generating the excess current. The diode D1 used in the limiting circuit 60 may be a type of small leakage current and small scattering in the temperature dependence of the turning-on voltage.

Next, other modifications of the present light-receiving circuit will be described as referring to FIGS. 8 and 9.

In the first embodiment illustrated in FIG. 1 and the second embodiment in FIG. 6, the transistors, 20a and 20b, within the current minor circuit 20 compensates the decrease of the bias voltage $V_{APD}$ for the APD 40 to decrease the multiplication factor M thereof when the input optical level increases. On the other hand, although the output of the voltage source 10 is kept constant, the current therefrom increases at the larger input optical level which increases the power dissipation at the large input level. It may save the power dissipation of the light-receiving circuit that, the voltage drop at the transistors, 20d and 20e, within the current mirror circuit 20 should constant, while the output of the voltage source 10 decreases as the input optical level increases. The modified circuits, 1a and 3a, shown in FIGS. 8 and 9 realize this function to save the power dissipation at the large input level.

In the embodiments above explained, since the current of the APD 40 is first controlled to obtain the optimal multiplication factor M, the bias voltage $V_{APD}$ applied to the APD 40 is undefined. That is, the voltage drop at the transistor 20a constituting the current mirror circuit 20 and connected to the cathode of the APD 40 also becomes undefined. Therefore, in the modified embodiments, 1a and 3a, shown in FIG. 8 and FIG. 9, the voltage source 10 are so controlled to balance the voltages of the output terminals, 20c and 20d, of the current mirror circuit 20.

The feedback control circuit 70 provides resistors, R7 to R10, in the input thereof to divide the voltage of the output terminals, 20d and 20e, which is relative high, into an acceptable value as the input level of the amplifier 70a. The output of the amplifier 70a is connected to the input of the high voltage source 10 to adjust the output thereof. Thus, constituting the feedback circuit of the high voltage source 10, the current mirror circuit 20, and the feedback control circuit 70, the amplifier 70a lowers the output of the high voltage source 10 such that the output terminal, 20d and 20e, of the current mirror circuit 20, which is the input of the amplifier 70a, becomes equal to each other. Accordingly, the power dissipation by the transistors, 20a and 20b, constituting the current mirror circuit 20 may be reduced.

Figure 8:
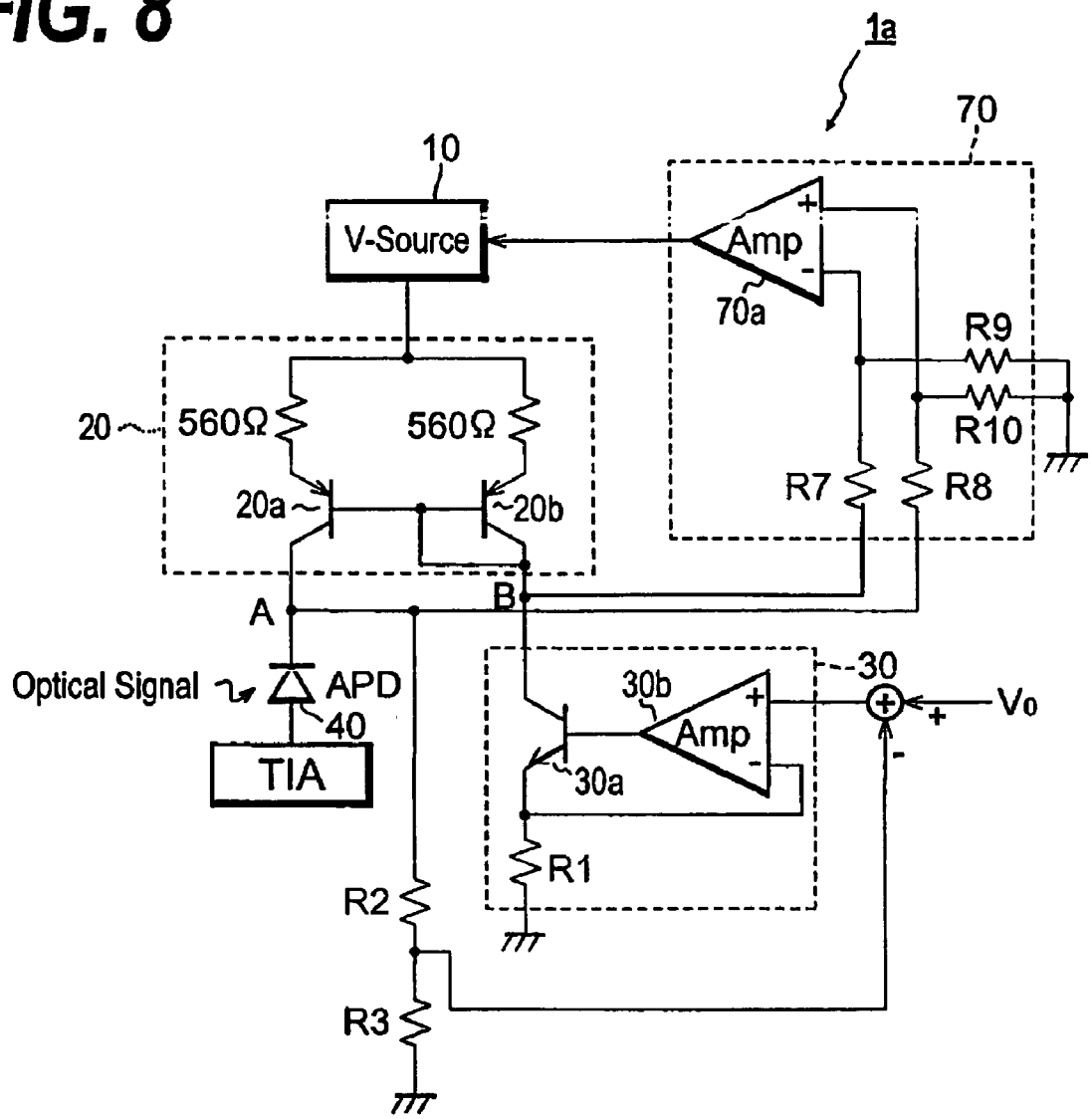
FIG. 8 is a circuit diagram of the light-receiving circuit according to one modification of the first embodiment of the invention.

Specifically explaining the operation of the voltage feedback with referring to FIG. 8, when no voltage feedback control is provided, which means that the voltage source 10 outputs the constant voltage, the voltage difference between this output of the voltage source 10 and the bias voltage $V_{APD}$ is wholly consumed by the transistor 20a and the resistor within the current mirror circuit 20. While, because the base and the collector are short-circuited in the other transistor 20b, the voltage difference is mainly consumed by the collector-emitter voltage of the transistor 30a in the current source 30. In order to secure the bias voltage $V_{APD}$ high under no input optical signal the output of the voltage source 10 must be high enough, which raises the power dissipation of the transistor 20a used in the current mirror circuit 20 in the case that no voltage feedback is provided.

The modified embodiment shown in FIG. 8 provides the circuit to reduce the power dissipation of the transistor by setting the output of the voltage source 10 to a minimum value necessary for the transistor 20a to operate as the current mirror circuit 20. The operation of the feedback is that, by monitoring the voltage at output terminals, 20d and 20e, the amplifier 70a controls the voltage source 10 to set these voltages equal to each other. The resistors from R7 to R8 constitute a voltage divider to lower the input level for the amplifier 70a.

In this voltage feedback circuit, the gain of the amplifier 70a is preferable to be not high, which means that the feedback loop may be stable even when a substantial difference exists in the voltage between the node A and the node B. When the difference between the node A and the node B disappears, the base potential and the collector potential of the transistor 20a connected to the APD 40 must be equal, i.e., it is equivalently short-circuited same as the other transistor 20b. Such bias condition may not operate the transistor in ordinal. By setting the closed-loop gain of the voltage feedback control to be 2 to 5, enough suppression in the power dissipation, i.e., the lowering the output of the high voltage source 10, can be realized.

Figure 9:
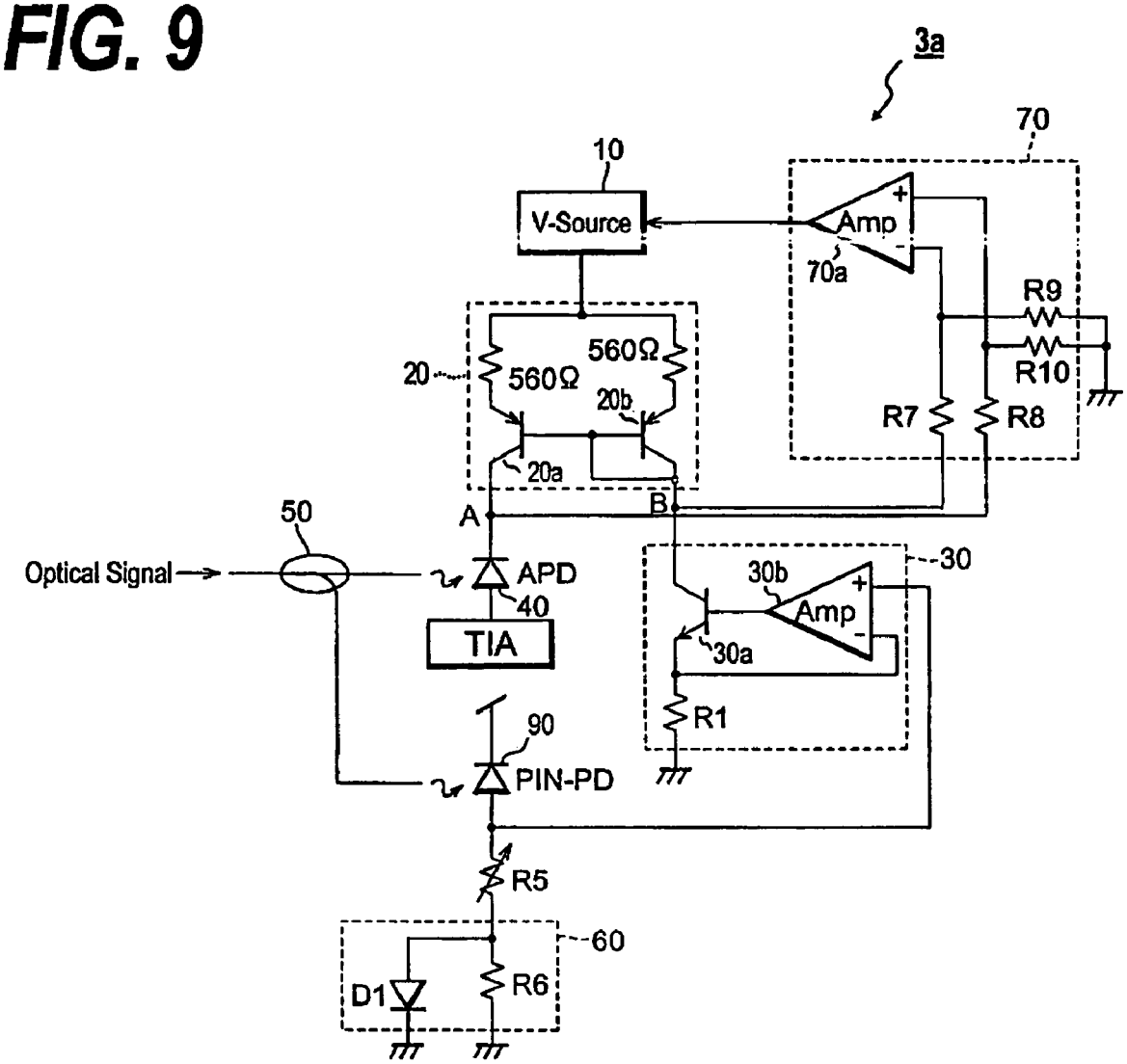
FIG. 9 is a circuit diagram of the light-receiving circuit according to another modification of the second embodiment of the invention

FIG. 9 is a modified circuit diagram of the third embodiment shown in FIG. 6 that provides the voltage feedback comprising the voltage source 10, the current mirror circuit 20, and the feedback control circuit 70, which is the same as those shown in FIG. 8. The operation and the function thereof are same as those explained above.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A light-receiving circuit for receiving an input optical signal, comprising:
   a voltage source for providing a voltage output;
   a first current mirror circuit having an input terminal for receiving said voltage output from said voltage source, a current setting terminal for providing a bias voltage, and a current mirroring terminal;
   an avalanche photodiode for receiving said input optical signal, said avalanche photodiode being connected to said current mirroring terminal of said first current mirror circuit to receive said bias voltage;
   a current source connected to said current setting terminal of said first current mirror circuit, said current source generating a reference current, and
   a PIN-photodiode for receiving a portion of said input optical signal, said PIN-photodiode outputting a monitored current,
   wherein said current source reflects said monitored current in said reference current, and
   wherein said bias voltage varies so as to cause said reference current to flow in said avalanche photodiode.

2. The light-receiving circuit according to claim 1, wherein said current source includes a reference resistor, and a transistor connected between said current setting terminal of said first current mirror circuit and said reference resistor, said transistor outputting said reference current such that a voltage generated in said reference resistor due to said reference current corresponds to said bias voltage.

3. The light-receiving circuit according to claim 1, further includes a first reference resistor connected in serial to said PIN-photodiode to convert said monitored current generated in said PIN-photodiode into a reference voltage, wherein said current source includes a second reference resistor and a transistor connected between said current setting terminal of said first current mirror circuit and said second reference resistor, said transistor outputting said reference current such that a voltage generated in said second reference resistor due to said reference current corresponds to said reference voltage generated in said first reference resistor.

4. The light-receiving circuit according to claim 3, further includes a limiting circuit configured to limit said reference voltage.

5. The light-receiving circuit according to claim 4, wherein said limiting circuit includes a diode and a third resistor connected in parallel to said diode, said diode and said third resistor being each connected in serial to said first reference resistor, said diode cramping said reference voltage.

6. The light-receiving circuit according to claim 1, further includes a second current mirror circuit having a current setting terminal and a current mirroring terminal, said current setting terminal being connected to said PIN-photodiode, said current mirroring terminal being connected to said current setting terminal of said first current mirror circuit, wherein said monitored current generated by said PIN-photodiode is reflected in said reference current flowing in said avalanche photodiode through said first and second current mirror circuits.

7. The light-receiving circuit according to claim 1, further includes a feedback control circuit for lowering said voltage output of said voltage source by receiving said bias voltage.

8. The light-receiving circuit according to claim 7, wherein said feedback control circuit includes a differential amplifier for receiving said bias voltage and a voltage of said current setting terminal of said first current mirror circuit and for controlling said voltage source such that said voltage of said current setting terminal becomes substantially equal to said bias voltage.

9. The light-receiving circuit according to claim 8, wherein a closed-loop gain of said feedback circuit including said voltage source, said first current mirror circuit, and said feedback control circuit is 2 to 5.

10. A light-receiving circuit for receiving an input optical signal, comprising:
a voltage source for outputting a voltage output;
a first current mirror circuit including a pair of transistors, said current mirror circuit having an input terminal, a current-setting terminal and a current-mirroring terminal, said input terminal being configured to couple with emitters of each transistor and to receive said voltage output from said voltage source, said current-setting terminal being configured to couple with a collector of one of said transistors and to couple with bases of each transistor, said current-mirroring terminal being configured to couple with a collector of the other of said transistors to output a bias voltage, said collector and said base of said one transistor being short-circuited;
an avalanche photodiode for receiving said input optical signal, said avalanche photodiode being connected to said current-mirroring terminal of said first current mirror circuit to receive said bias voltage; and
a current source connected to said current setting terminal of said first current mirror circuit, said current source generating a reference current,
wherein said bias voltage varies so as to have said reference current flow in said avalanche photodiode.

11. The light-receiving circuit according to claim 10, further includes a feedback control circuit for lowering said voltage output of said voltage source by receiving said bias voltage.

12. The light-receiving circuit according to claim 11, wherein said feedback control circuit includes a differential amplifier for receiving said bias voltage and a voltage of said current setting terminal of said first current mirror circuit and for controlling said voltage source such that said voltage of said current setting terminal becomes substantially equal to said bias voltage.

13. The light-receiving circuit according to claim 10, wherein said reference current is determined so as to reflect said bias voltage.

14. The light-receiving circuit according to claim 13, wherein said reference current is determined by a difference between said bias voltage dropped by a preset ratio and an externally provided signal.

* * * * *